(12) United States Patent
Ahn et al.

(10) Patent No.: US 7,999,261 B2
(45) Date of Patent: Aug. 16, 2011

(54) THIN FILM TRANSISTOR, METHOD OF FABRICATING THE SAME, AND ORGANIC LIGHT EMITTING DIODE DISPLAY DEVICE HAVING THE TFT

(75) Inventors: Ji-Su Ahn, Suwon-si (KR); Byoung-Keon Park, Suwon-si (KR); Tae-Hoon Yang, Suwon-si (KR); Jin-Wook Seo, Suwon-si (KR); Kil-Won Lee, Suwon-si (KR); Ki-Yong Lee, Suwon-si (KR); Sung-Chul Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/357,513

(22) Filed: Jan. 22, 2009

(65) Prior Publication Data

US 2009/0189160 A1 Jul. 30, 2009

(30) Foreign Application Priority Data

Jan. 25, 2008 (KR) ........................ 10-2008-0008159

(51) Int. Cl.
*H01L 29/10* (2006.01)

(52) U.S. Cl. .... 257/66; 257/288; 257/377; 257/E29.294
(58) Field of Classification Search ........................ None
See application file for complete search history.

(56) References Cited

U.S. PATENT DOCUMENTS

| 6,855,954 | B1 | 2/2005 | Zhang | |
|---|---|---|---|---|
| 2004/0263706 | A1 | 12/2004 | Cho et al. | |
| 2006/0071211 | A1* | 4/2006 | Lee | ................................ 257/59 |
| 2008/0315207 | A1* | 12/2008 | Yang et al. | ..................... 257/66 |

FOREIGN PATENT DOCUMENTS

| CN | 1761074 | 4/2006 |
|---|---|---|
| JP | 2001-119029 | 4/2001 |
| JP | 2003-051600 | 2/2003 |
| KR | 2001-98463 | 11/2001 |
| KR | 2002-62276 | 7/2002 |
| KR | 2005-2563 | 1/2005 |
| KR | 10-2005-0113036 | 12/2005 |
| KR | 10-2006-0015196 | 2/2006 |
| KR | 2007-76116 | 7/2007 |
| WO | WO 02/01603 | 1/2002 |

* cited by examiner

*Primary Examiner* — Jarrett J Stark
(74) *Attorney, Agent, or Firm* — H.C. Park & Associates, PLC (57) ABSTRACT

A thin film transistor (TFT), a method of fabricating the same, and an organic light emitting diode (OLED) display device having the TFT, the TFT including a substrate, a gate electrode disposed on the substrate, a gate insulating layer disposed on the gate electrode, a semiconductor layer disposed on the gate insulating layer and crystallized using a metal catalyst, and source and drain electrodes disposed on the semiconductor layer and electrically connected to source and drain regions of the semiconductor layer. A second metal is diffused into a surface region of the semiconductor layer, to getter the metal catalyst from a channel region of the semiconductor layer. The second metal can have a lower diffusion coefficient in silicon than the metal catalyst.

10 Claims, 8 Drawing Sheets

THIN FILM TRANSISTOR, METHOD OF FABRICATING THE SAME, AND ORGANIC LIGHT EMITTING DIODE DISPLAY DEVICE HAVING THE TFT

CROSS-REFERENCE TO RELATED APPLICATIONS

This application claims the benefit of Korean Patent Application No. 2008-8159, filed Jan. 25, 2008, the disclosure of which is hereby incorporated herein by reference in its entirety.

BACKGROUND OF THE INVENTION

1. Field of the Invention

Aspects of the present invention relate to a thin film transistor (TFT), a method of fabricating the same, and an organic light emitting diode (OLED) display device having the TFT.

2. Description of the Related Art

In general, a polycrystalline silicon (poly-Si) layer is widely used as a semiconductor layer of a thin film transistor (TFT), because the poly-Si layer has a high field-effect mobility, can be applied to a high-speed operating circuit, and can be used to configure a complementary-metal-oxide-semiconductor (CMOS) circuit. A TFT including the poly-Si layer is typically used as an active device of an active-matrix liquid crystal display (AMLCD), or a switching or driving device of an organic light emitting diode (OLED).

Methods of crystallizing an amorphous silicon (a-Si) layer into a poly-Si layer may include a solid phase crystallization (SPC) method, an excimer laser crystallization (ELC) method, a metal induced crystallization (MIC) method, and a metal induced lateral crystallization (MILC) method. In the SPC method, an a-Si layer is annealed for several hours, at temperatures below 700° C., at which a glass substrate used in a TFT is transformed. In the ELC method, excimer laser beams are radiated onto an a-Si layer, so that the a-Si layer is heated to a high temperature, in a very short amount of time. In the MIC method, a metal, such as nickel (Ni), palladium (Pd), gold (Au), or aluminum (Al), is brought into contact with, or doped into, an a-Si layer to induce a phase change of the a-Si layer into a poly-Si layer. In the MILC method, a silicide, formed by reaction of the metal with silicon, laterally diffuses, so as to sequentially induce crystallization of an a-Si layer.

However, the SPC method takes too much time and may lead to the deformation of a substrate, because the substrate is annealed at a high temperature, for a long period of time. Also, the ELC method requires an expensive laser apparatuses and results in the formation of protrusions on a poly-Si surface, thereby degrading the interfacial characteristics between a semiconductor layer and a gate insulating layer. Furthermore, when the MIC or MILC method is employed, a large amount of metal catalyst may remain in a crystallized poly-Si layer, thereby increasing the leakage current from a semiconductor layer of a TFT.

A vast amount of research has been conducted on methods of crystallizing an a-Si layer using a metal catalyst, because the a-Si layer can be crystallized at a lower temperature, for a shorter amount of time, than in an SPC method. Typical methods of crystallizing an a-Si layer using a metal catalyst include an MIC method and an MILC method. In these methods, however, the device characteristics of a TFT may be degraded, due to contamination caused by the metal catalyst.

In order to prevent the contamination caused by the metal catalyst, after the a-Si layer is crystallized using the metal catalyst, a gettering process is performed to remove the metal catalyst. A conventional gettering process may be performed using impurities, such as phosphorus (P) or a noble gas, or by forming another a-Si layer on a poly-Si layer. However, the metal catalyst is not removed effectively from the poly-Si layer, so that a leakage current is still large. Furthermore, in the fabrication process of a top-gate TFT, a gettering site is generally far from a channel region of a semiconductor layer, thereby reducing the effectiveness of the gettering.

SUMMARY OF THE INVENTION

Aspects of the present invention provide a bottom-gate thin film transistor (TFT), a method of fabricating a TFT, and an organic light emitting diode (OLED) display device having the TFT. A channel region of a semiconductor layer, which is crystallized using a metal catalyst layer, is gettered using a source/drain electrode material layer as a gettering site, so as to reduce the amount of the metal catalyst in the channel region, thereby improving the electrical properties of the TFT.

According to an aspect of the present invention, a TFT includes: a substrate; a gate electrode disposed on the substrate; a gate insulating layer disposed on the gate electrode; a semiconductor layer disposed on the gate insulating layer, which is crystallized using a metal catalyst; and source and drain electrodes disposed on the semiconductor layer, which are electrically connected to source and drain regions of the semiconductor layer. A second metal, or a silicide of the second metal, is diffused into a surface region of the semiconductor layer, under the source and drain electrodes, to a predetermined depth.

According to another aspect of the present invention, a method of fabricating a TFT includes: forming a gate electrode on the substrate; forming a gate insulating layer on the gate electrode; forming an amorphous silicon (a-Si) layer on the gate insulating layer; crystallizing the a-Si layer into a polycrystalline silicon (poly-Si) layer, using a metal catalyst; patterning the poly-Si layer to form a semiconductor layer; forming a source/drain electrode material layer on the semiconductor layer; and annealing the substrate to getter the metal catalyst in a channel region of the semiconductor layer, into a surface region of the semiconductor layer that contacts the source/drain electrode material layer.

According to still another aspect of the present invention, an OLED display device includes: a substrate; a gate electrode disposed on the substrate; a gate insulating layer disposed on the gate electrode; a semiconductor layer disposed on the gate insulating layer, which is crystallized using a metal catalyst; source and drain electrodes disposed on the semiconductor layer, which are electrically connected to source and drain electrodes of the semiconductor layer; a first electrode electrically connected to one of the source and drain electrodes; an organic layer disposed on the first electrode and including an emission layer (EML); and a second electrode disposed on the organic layer. A second metal, or a silicide of the second metal, is diffused into a surface region of the semiconductor layer, under the source and drain electrodes, to a predetermined depth.

Additional aspects and/or advantages of the invention will be set forth in part in the description which follows, and in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EMBODIMENTS

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Figure 1A:
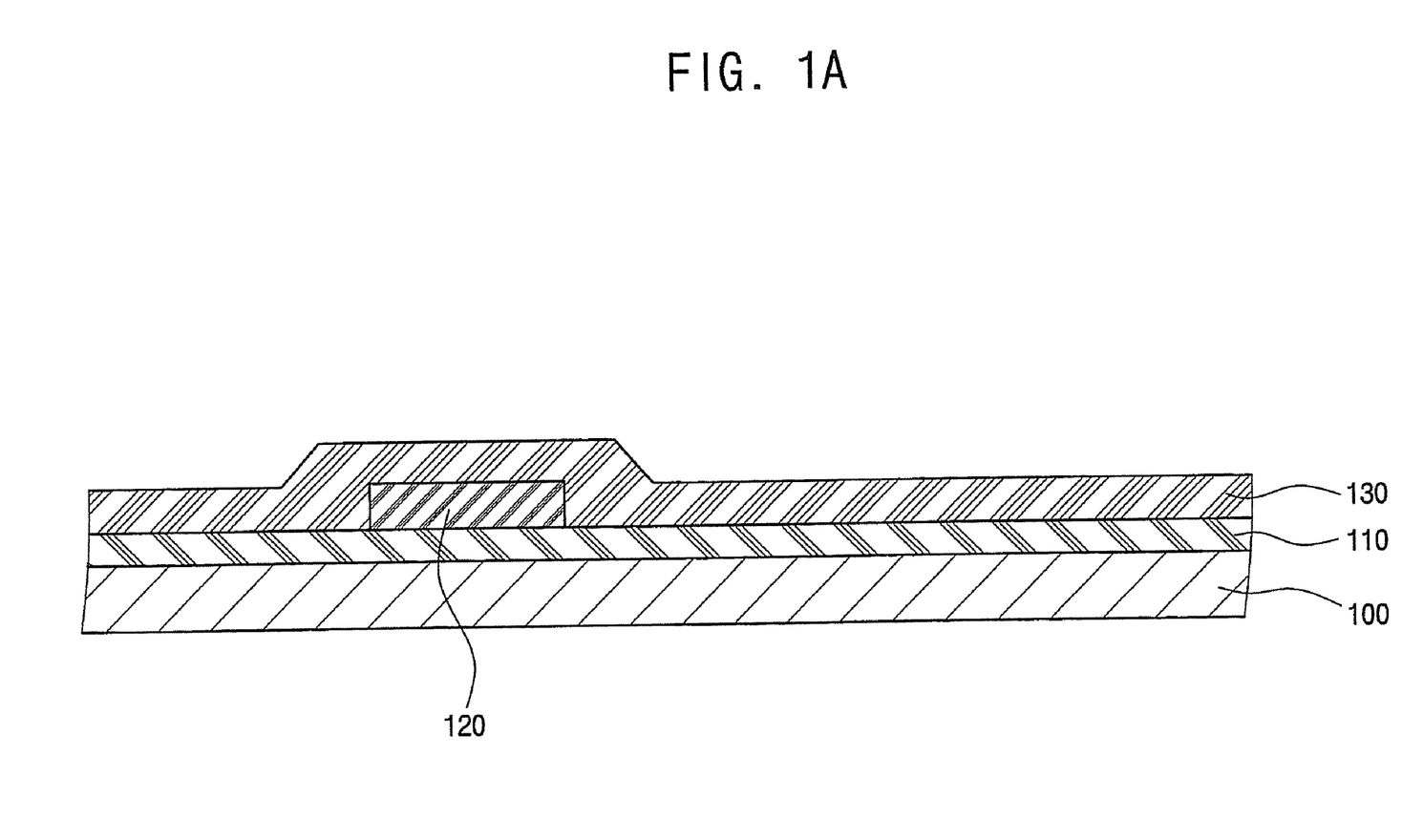
FIGS. 1A through 1D are cross-sectional views illustrating a crystallization process, according to an exemplary embodiment of the present invention.

FIGS. 1A through 1D are cross-sectional views illustrating a crystallization process, according to an exemplary embodiment of the present invention. Referring to FIG. 1A, a buffer layer 110 is formed on a substrate 100, such as a glass substrate, or a plastic substrate. The buffer layer 110 may be formed by depositing at least one insulating layer, using a chemical vapor deposition (CVD) or a physical vapor deposition (PVD) technique. The insulating layer may be, for example, a silicon oxide layer, or a silicon nitride layer. The buffer layer 110 may prevent the diffusion of moisture or impurities generated in the substrate 100, and can control the transmission rate of heat during a crystallization process, thereby facilitating the crystallization of an amorphous silicon (a-Si) layer.

A metal layer (not shown) for a gate electrode is formed on the buffer layer 110. The metal layer may be a single layer formed of aluminum (Al), or an Al alloy, such as aluminum-neodymium (Al—Nd), or a double layer formed by stacking an Al alloy on a molybdenum (Mo) alloy. The metal layer is etched using a photolithographic etching process, thereby forming a gate electrode 120 in a portion corresponding to a channel region of a semiconductor layer.

A gate insulating layer 130 is formed on the gate electrode 120. The gate insulating layer 130 may be a silicon oxide layer, a silicon nitride layer, or a double layer thereof.

Figure 1B:
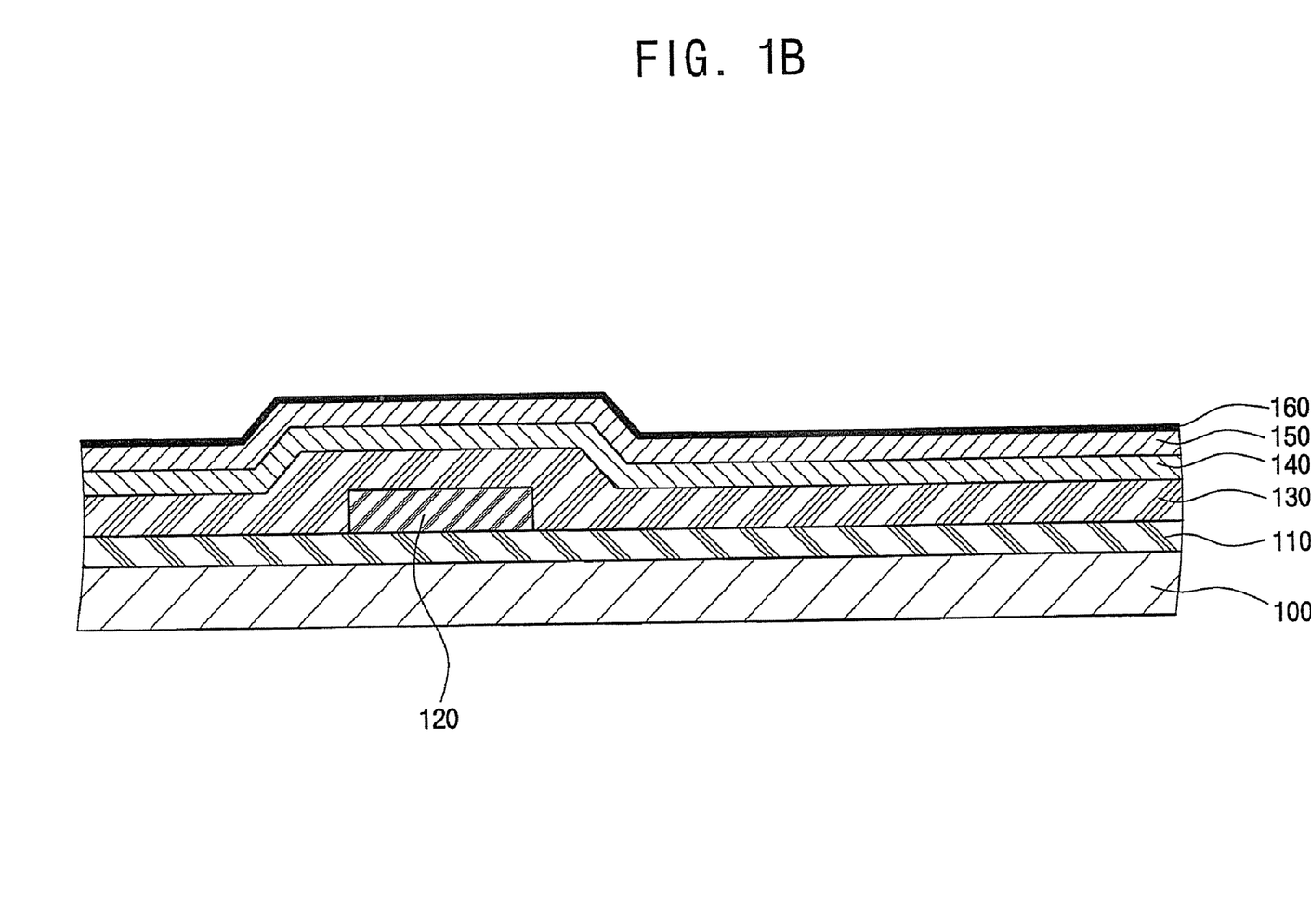

Referring to FIG. 1B, an amorphous silicon (a-Si) layer 140 is formed on the substrate 100. A capping layer 150 and a metal catalyst layer 160 are formed on the a-Si layer 140. Specifically, the a-Si layer 140 is formed on the gate insulating layer 130. The a-Si layer 140 may be formed using a CVD or a PVD technique. During or after the formation of the a-Si layer 140, a dehydrogenation process may be performed to lower the concentration of hydrogen.

Thereafter, the a-Si layer 140 is crystallized into a polycrystalline silicon (poly-Si) layer. The a-Si layer 140 is crystallized into the poly-Si layer, by a crystallization method using a metal catalyst, such as a metal induced crystallization (MIC) method, a metal induced lateral crystallization (MILC) method, or a super grain silicon (SGS) crystallization method.

In the MIC method, a metal, such as nickel (Ni), palladium (Pd), gold (Au), or aluminum (Al), is diffused or doped into, an a-Si layer, to induce a phase change of the a-Si layer into a polycrystalline silicon (poly-Si) layer. In the MILC method, a silicide, formed by reacting the metal with silicon, laterally diffuses, so as to sequentially induce crystallization of an a-Si layer.

In the SGS method, the concentration of a metal catalyst diffused into an a-Si layer is controlled, so that crystal grains are formed to a size of several μm to several hundreds of μm. In an exemplary embodiment, in order to lower the concentration of the metal catalyst diffused into the a-Si layer, a capping layer may be formed on the a-Si layer, and a metal catalyst layer may be formed on the capping layer and annealed, so as to diffuse the metal catalyst into the a-Si layer. In another exemplary embodiment, the metal catalyst layer may be formed at a low concentration, without forming the capping layer, thereby lowering the concentration of the metal catalyst in the a-Si layer.

In exemplary embodiments of the present invention, the a-Si layer 140 may be crystallized into the poly-Si layer, by an SGS crystallization method. Thus, since a capping layer 150 is formed, the concentration of a metal catalyst in the a-Si layer 140 may be effectively lowered, as compared with an MIC or MILC method. Hereinafter, an SGS crystallization method according to an exemplary embodiment of the present invention will be described.

The capping layer 150 is formed on the a-Si layer 140. The capping layer 150 may be a silicon nitride layer, or a double layer of a silicon nitride layer and a silicon oxide layer. A metal catalyst may be diffused into the capping layer 150, during an annealing process. The capping layer 150 may be formed using a CVD or PVD technique. The capping layer 150 may be formed to a thickness of about 1 to 2000 Å. When the capping layer 150 is formed to a thickness of less than 1 Å, the capping layer 150 may not properly control the amount of a metal catalyst that diffuses into the a-Si layer 140. When the capping layer 150 is formed to a thickness of more than 2000 Å, only a small amount of a metal catalyst may diffuse into the a-Si layer 140, so that it is difficult to crystallize the a-Si layer 140 into a poly-Si layer.

Thereafter, a metal catalyst layer 160 is deposited on the capping layer 150. The metal catalyst layer 160 may include a metal catalyst selected from the group consisting of Ni, Pd, Ti, Ag, Au, Al, Sn, Sb, Cu, Co, Mo, Tr, Ru, Rh, Cd, and Pt. The metal catalyst layer 160 may be formed to an areal density of about $10^{11}$ to $10^{15}$ atoms/cm² on the capping layer 150. When the metal catalyst layer 160 is formed to an areal density lower than about $10^{11}$ atoms/cm², only a small number of seeds are formed, thereby inhibiting the crystallization of the a-Si layer 140. When the metal catalyst layer 160 is formed to an areal density more than about $10^{15}$ atoms/cm², the amount of the first metal that diffuses into the a-Si layer 140 is increased, thereby causing an MIC process, rather than the SGS process. Also, the amount of the remaining metal catalyst layer 160 is increased, so that the characteristics of a semiconductor layer formed by patterning the poly-Si layer may be degraded.

Figure 1C:
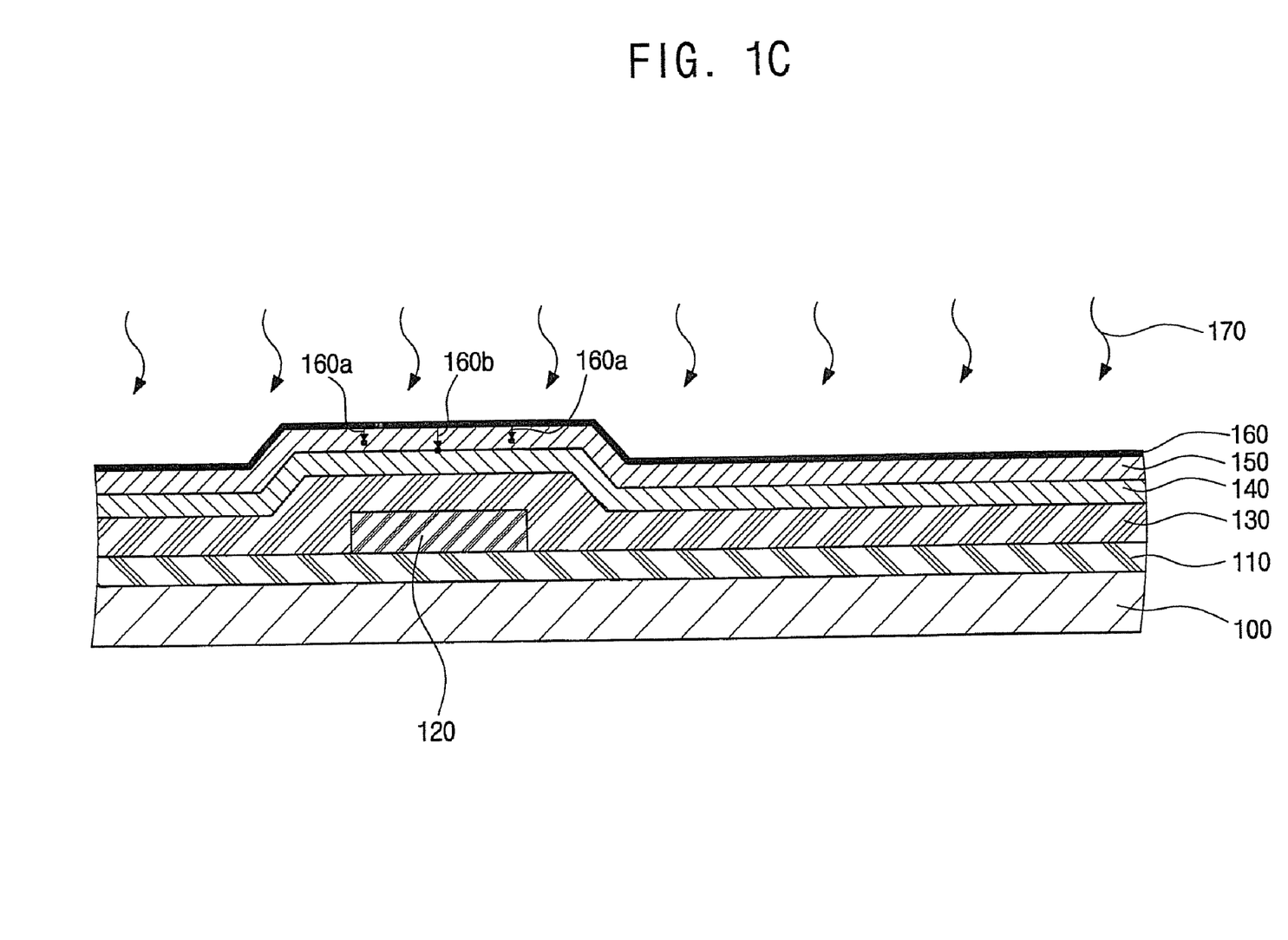

Referring to FIG. 1C, the substrate 100 is annealed, to diffuse the metal catalyst through the capping layer 150, into the a-Si layer 140. Specifically, heat 170 is radiated to the metal catalyst layer 160, so that a portion of the metal catalyst layer 160 is diffused into the a-Si layer 140. During the annealing, only a small amount 160*b* of the metal catalyst layer 160 passes through the capping layer 150, and diffuses into the surface of the a-Si layer 140, while a large amount 160*a* of the metal catalyst layer 160 is prevented from diffusing, by the capping layer 150.

Thus, the amount of the metal catalyst diffused into the surface of the a-Si layer 140 may depend on the diffusion barrier capability of the capping layer 150, which is closely related to the thickness of the capping layer 150. In other words, as the thickness of the capping layer 150 increases, the diffused amount of the metal catalyst decreases, and the size of crystal grains increases. Conversely, as the thickness of the capping layer 150 decreases, the diffused amount of a metal catalyst increases, and the size of the crystal grains decreases.

The annealing process may be performed at a temperature of about 200 to 900° C., for from several seconds to several hours. When the annealing process is performed under the above-described conditions, the deformation of the substrate 100, due to overheating, may be prevented, and desired fabrication costs and yields can be obtained. The heat 170 may be produced using any one of a furnace process, a rapid thermal annealing (RTA) process, an ultraviolet (UV) process, and a laser induction process.

Figure 1D:
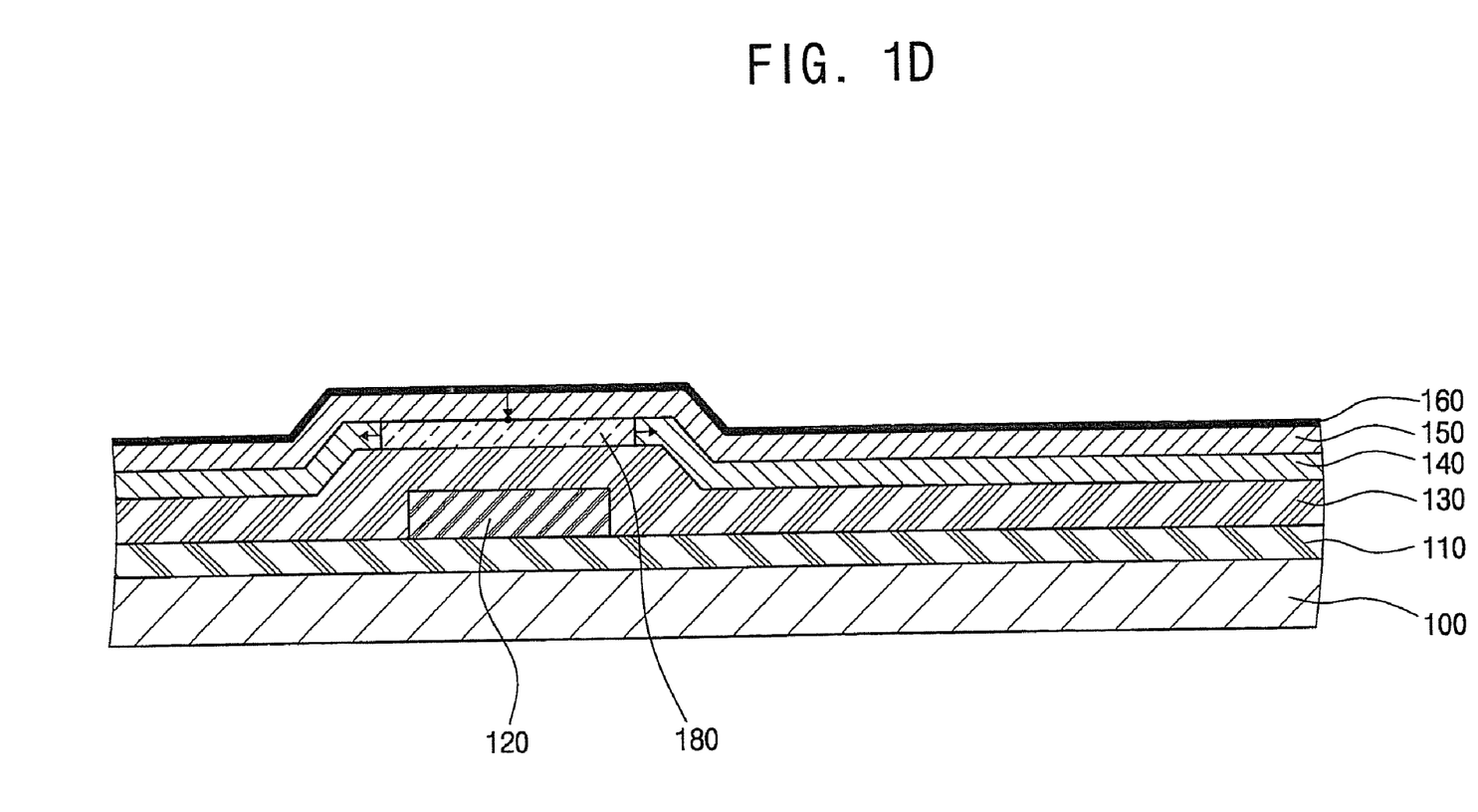

Referring to FIG. 1D, the a-Si layer 140 is crystallized into a polycrystalline silicon (poly-Si) layer 180, as the metal catalyst 160*b* diffuses there through. Specifically, the metal catalyst 160*b* passes through the capping layer 150, diffuses into the a-Si layer 140, and the a-Si layer 140 is crystallized into the poly-Si layer 180. The diffused metal catalyst 160*b* combines with the Si of the a-Si layer 140, to form a metal silicide. The metal silicide forms seeds for the crystallization of the poly-Si layer 180.

In FIG. 1D the annealing process 170 is performed on the structure having the capping layer 150 and the metal catalyst layer 160, after the metal catalyst is diffused into the surface of the a-Si layer 140, to form the metal silicide. However, according to other exemplary embodiments, the capping layer 150 and the metal catalyst layer 160 may be removed before the annealing process 170 is performed.

Figure 2A:
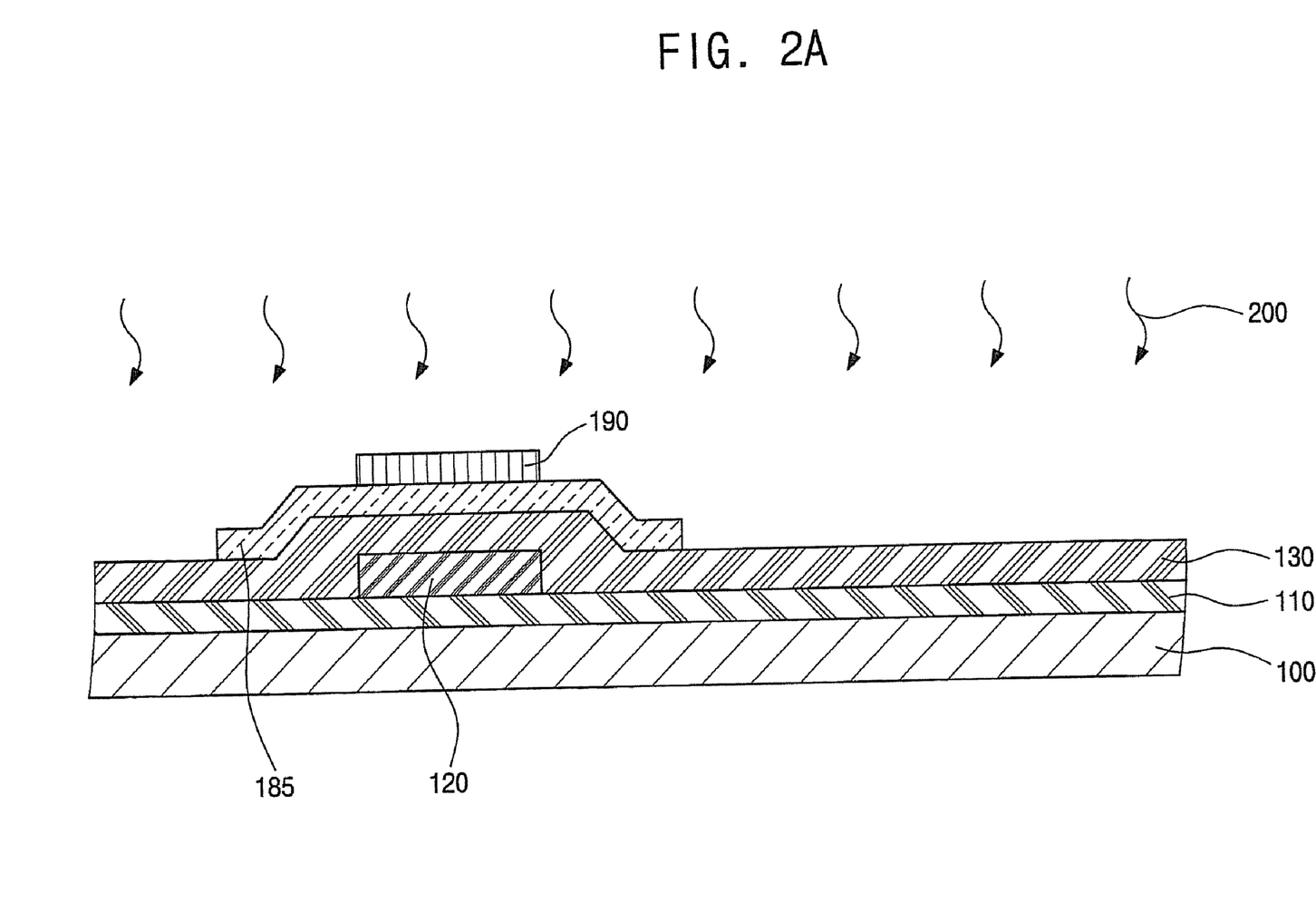
FIGS. 2A through 2C are cross-sectional views illustrating a method of fabricating a bottom-gate thin film transistor (TFT), according to an exemplary embodiment of the present invention.
Figure 2B:
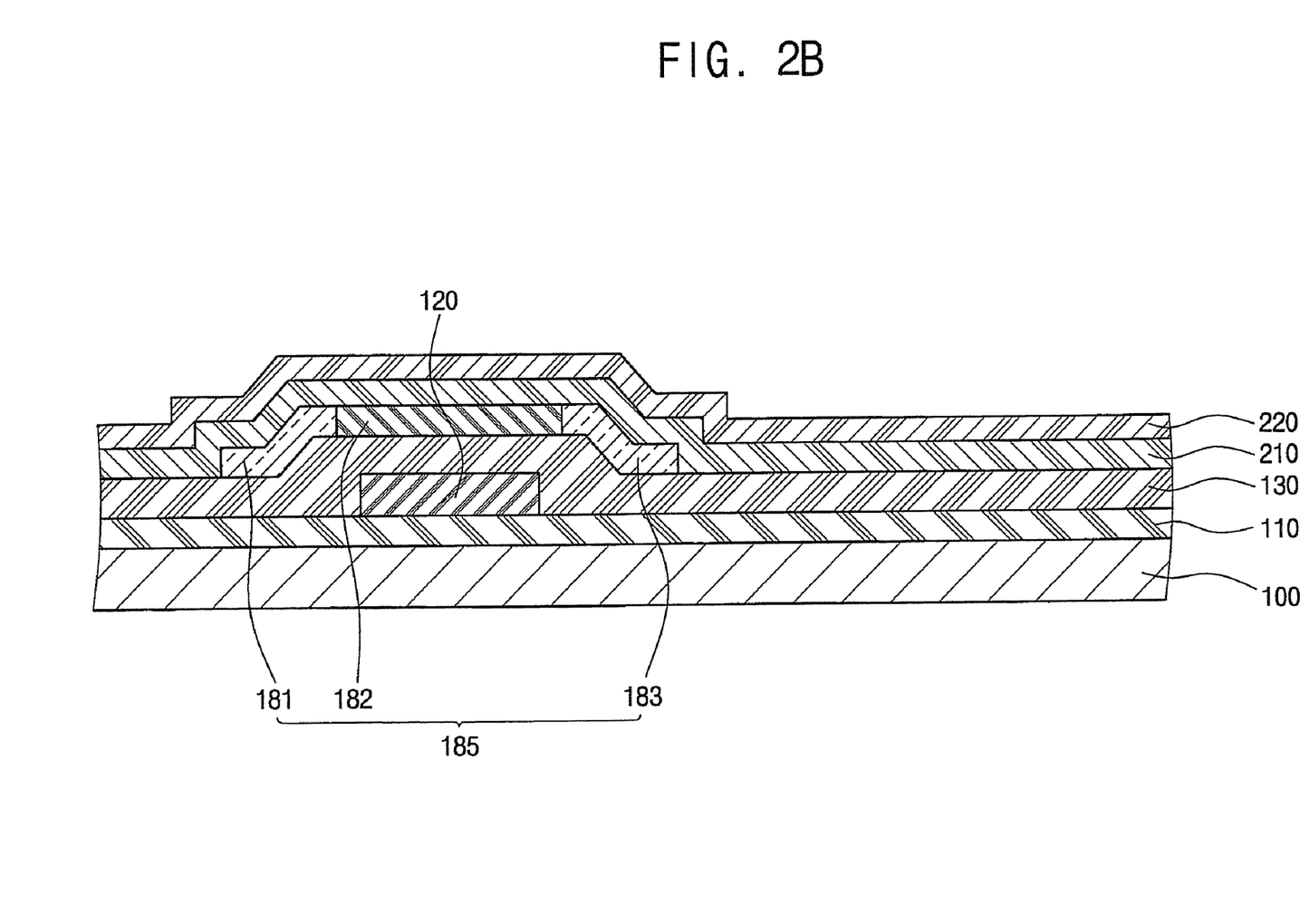
Figure 2C:
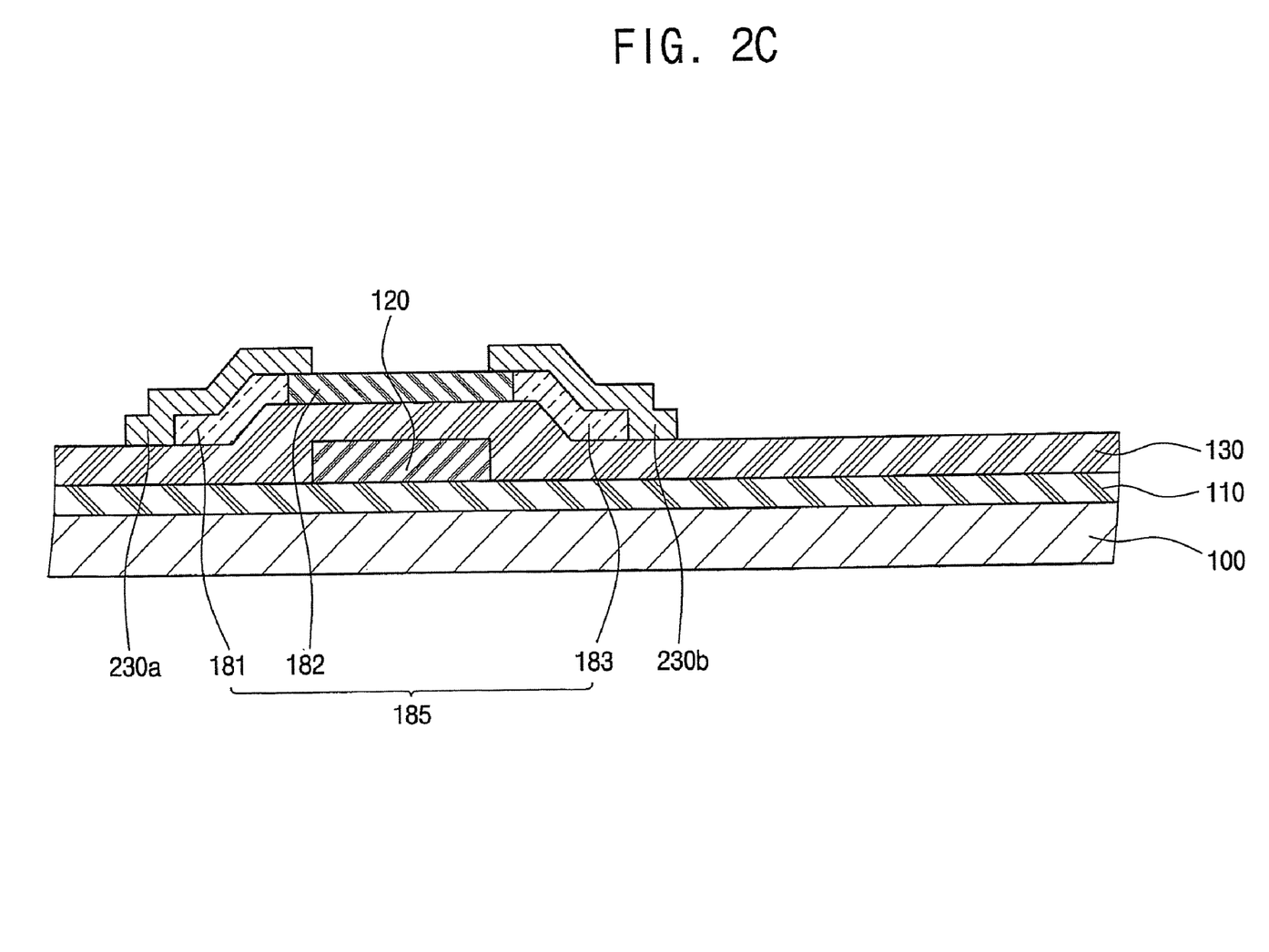

FIGS. 2A through 2C are cross-sectional views illustrating a method of fabricating a bottom-gate TFT, according to an exemplary embodiment of the present invention. Referring to FIG. 2A, a semiconductor layer 185 is formed on a substrate 100 having a buffer layer 110, a gate electrode 120, and a gate insulating layer 130, using the SGS crystallization process, as described with reference to FIGS. 1A through 1D.

A photoresist pattern 190 is formed on the semiconductor layer 185. Thereafter, conductive impurity ions 200 are doped into portions of the semiconductor layer 185, using the photoresist pattern 190 as a mask, thereby forming a source region 181, a drain region 183, and a channel region 182, as shown in FIG. 2B. In this case, the conductive impurity ions 200 may be p-type impurity ions or n-type impurity ions. The p-type impurity ions may be ions of one selected from the group consisting of boron (B), aluminum (Al), gallium (Ga), and indium (In), and the n-type impurities may be ions of one selected from the group consisting of phosphorus (P), arsenic (As), and antimony (Sb).

Referring to FIG. 2B, a source/drain electrode material layer 210 and a thermal oxidation barrier layer 220 are formed on the substrate 100. Specifically, the source/drain electrode material layer 210 is formed on the gate insulating layer 130 and the semiconductor layer 185. The thermal oxidation barrier layer 220 is formed on the source/drain electrode material layer 210. The source/drain electrode material layer 210 may be a single layer formed of one selected from the group consisting of Ti, Cr, Mo, W, and an alloy thereof. The source/drain electrode material layer 210 may include layers of Ti/Al/Ti or Mo/Al/Mo.

After depositing the source/drain electrode material layer 210, a gettering process is performed, by an annealing process, using a region of the semiconductor layer 185. The source/drain electrode material layer 210 may be formed of a second metal, or an alloy thereof, having a lower diffusion coefficient than the metal catalyst used for the crystallization of the semiconductor layer 185.

In the semiconductor layer 185, the diffusion coefficient of the second metal may be 1%, or less, than the diffusion coefficient of the metal catalyst. When the diffusion coefficient of the second metal (or a metal silicide thereof), is 1%, or less, of the diffusion coefficient of the metal catalyst, the second metal may be prevented from adequately diffusing into the semiconductor layer 185.

Nickel (Ni) is widely used as the metal catalyst for the crystallization of the semiconductor layer 185. Ni has a diffusion coefficient of about $10^{-5}$ cm$^2$/s, or less, in the semiconductor layer 185. When Ni is used as the metal catalyst, the source/drain electrode material layer 210 may be formed of a second metal having a diffusion coefficient of 1%, or less, of the diffusion coefficient of Ni. That is, the second metal may have a diffusion coefficient ranging between about 0 and $10^{-7}$ cm$^2$/s. The source/drain electrode material layer 210 may be a single layer formed of one selected from the group consisting of Ti, Cr, Mo, W, and an alloy thereof. The source/drain electrode material layer 210 may include layers of Ti/Al/Ti or Mo/Al/Mo.

Thereafter, the thermal oxidation barrier layer 220 may be formed on the source/drain electrode material layer 210. The thermal oxidation barrier layer 220 is used to prevent the oxidation of the source/drain electrode material layer 210, under annealing conditions, or the transformation of the surface of the source/drain electrode material layer 210, due to reaction of the source/drain electrode material layer 210 with N$_2$ gas, during a subsequent annealing/gettering process. The thermal oxidation barrier layer 220 may be formed of silicon oxide or silicon nitride. However, when the subsequent annealing/gettering process is performed in an inert gas atmosphere, the thermal oxidation barrier layer 220 may be omitted.

In order to remove the metal catalyst from the semiconductor layer 185, and specifically from the channel region 182, an annealing/gettering process is performed. As a result, the second metal of the source/drain electrode material layer 210 combines with the silicon of the semiconductor layer 185, to form a second metal silicide in a surface region of the semiconductor layer 185. The surface region contacts the source/drain electrode material layer 210. Thus, the second metal silicide is formed to a predetermined depth, which is measured from the surface of the semiconductor layer 185 that contacts the source/drain electrode material layer 210. A second metal silicide may form silicide layer in the semiconductor layer 185.

Due to the annealing/gettering process, the metal catalyst remaining in the channel region 182 is precipitated, and is prevented from any further diffusing. This is because the metal catalyst is thermodynamically more stable in the surface region containing the second metal silicide, than in the semiconductor layer 185 in general. Due to the above-described principle, the metal catalyst may be removed from the channel region 182.

The annealing process may be performed at a temperature of about 500 to 993° C., for from about 10 seconds to 10 hours. When the annealing process is performed at a temperature lower than 500° C., the metal catalyst may not properly diffuse into the semiconductor layer 185. When the annealing process is performed at a temperature higher than 993° C., a Ni metal catalyst may be in a solid phase, because the eutectic point of Ni in silicon is 993° C., and the substrate 100 may be deformed due to high temperatures.

When the annealing process is performed for less than 10 seconds, it may be difficult to sufficiently remove the metal catalyst from the channel region 182. When the annealing process is performed for longer than 10 hours, the substrate 100 may be deformed, and fabrication costs and yields may be negatively affected. When the annealing process is performed at a relatively high temperature, it is possible to remove the metal catalyst in a relatively short amount of time.

In order to enhance a gettering effect, n-type impurity ions or p-type impurity ions may be doped into the source and drain regions 181 and 183. The n-type impurity ions may be P ions, while the p-type impurity ions may be B ions. Alternatively, defects may be formed, using ions or plasma, in the source/drain regions 181 and 183, to enhance the contact with the source/drain electrode material layer 210, thereby enhancing the gettering effect.

Referring to FIG. 2C, the source/drain electrode material layer 210 is patterned, thereby forming source and drain electrodes 230a and 230b. Specifically, the substrate 100 having the source/drain electrode material layer 210 is annealed, and a layer of the second metal or a layer of the second metal silicide is formed to a predetermined depth in the surface region of the semiconductor layer 185. The surface region of the semiconductor layer 185 contacts the source/drain electrode material layer 210. Thereafter, the source/drain electrode material layer 210 is etched to expose the channel region 182, thereby forming the source and drain electrodes 230a and 230b.

During the patterning of the source/drain electrodes 230a and 230b, the surface region, which includes the gettered metal catalyst and the second metal silicide, is removed from the channel region 182 by etching. After forming the source and drain electrodes 230a and 230b, the annealing process may be repetitively performed, thereby gettering the metal catalyst into the surface region of the semiconductor layer 185.

Figure 3:
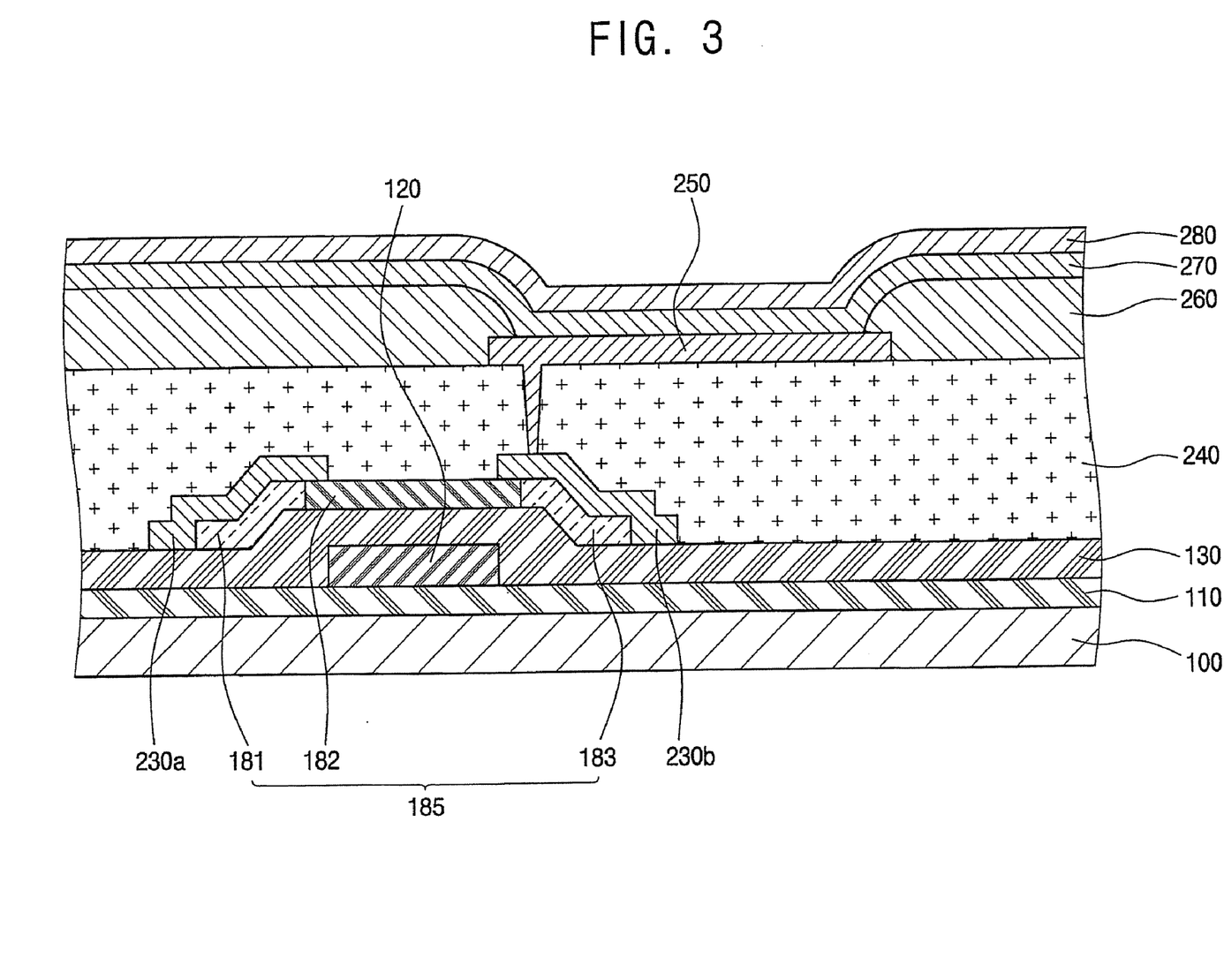
FIG. 3 is a cross-sectional view of an organic light emitting diode (OLED) display device, according to an exemplary embodiment of the present invention.

FIG. 3 is a cross-sectional view of an OLED display device having a TFT, according to an exemplary embodiment of the present invention. Referring to FIG. 3, an insulating layer 240 is formed on the surface of the substrate 100, which includes the TFT shown in FIG. 2C. The insulating layer 240 may be an inorganic layer or an organic layer. The inorganic layer may be one selected from the group consisting of a silicon oxide layer, a silicon nitride layer, and a silicate on glass (SOG) layer. The organic layer may be formed of one selected from the group consisting of a polyimide, a benzocyclobutene series resin, and an acrylate. Alternatively, the insulating layer 240 may include an organic layer and an inorganic layer.

The insulating layer 240 may be etched, thereby forming a hole exposing one of the source and drain electrodes 230a and 230b. A first electrode 250 is connected to one of the source and drain electrodes 230a and 230b, through the hole. The first electrode 250 may be an anode or a cathode. When the first electrode 250 is an anode, the first electrode 250 may be formed using a transparent material selected from the group consisting of indium tin oxide (ITO), indium zinc oxide (IZO), and indium tin zinc oxide (ITZO). When the first electrode 250 is a cathode, the first electrode 250 may be formed of one selected from the group consisting of Mg, Ca, Al, Ag, Ba, and an alloy thereof.

A pixel defining layer 260 is formed on the first electrode 250 and has an opening exposing a portion of the first electrode 250. An organic layer 270 having an emission layer (EML) is formed on the exposed portion of the first electrode 250. The organic layer 270 may further include at least one selected from the group consisting of a hole injection layer (HIL), a hole transport layer (HTL), a hole blocking layer (HBL), an electron blocking layer (EBL), an electron injection layer (EIL), and an electron transport layer (ETL). Thereafter, a second electrode 280 is formed on the organic layer 270. Thus, the fabrication of the OLED display is completed.

As described above, after the semiconductor layer 185 is formed, by patterning the poly-Si layer 180 that is crystallized using the metal catalyst, the source/drain electrode material layer 210 is formed of a second metal, or an alloy thereof, having a lower diffusion coefficient than the metal catalyst, on the semiconductor layer 185. The resulting structure is annealed, thereby removing the metal catalyst from a channel region 182 of the semiconductor layer 185. As a result, an off-current of the TFT can be markedly reduced. The source/drain electrode material layer 210 may be not only used as a gettering site, but also may be patterned to form the source and drain electrodes 230a and 230b. Therefore, the entire fabrication process of the TFT can be simplified.

According to aspects of the present invention, a source/drain electrode material layer can be used as a gettering site, thereby simplifying the fabrication of a TFT and removing the metal catalyst from a channel region of a semiconductor layer. As a result, a bottom-gate TFT having excellent electrical properties, such as a good leakage current characteristic, can be fabricated and applied to an OLED display device. Although only a bottom-gate TFT is described above in the exemplary embodiments, the present invention may be applied to a top-gate TFT.

Although a few exemplary embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A thin film transistor (TFT) comprising:
a substrate;
a gate electrode disposed on the substrate;
a gate insulating layer disposed on the gate electrode;
a semiconductor layer disposed on the gate insulating layer and crystallized using a metal catalyst; and
source and drain electrodes disposed on the semiconductor layer and electrically connected to respective source and drain regions of the semiconductor layer,
wherein a second metal, which is different from the metal catalyst, is diffused into a surface region of the semiconductor layer, which faces the source and drain electrodes,
wherein the second metal has a lower diffusion coefficient in the semiconductor layer than the metal catalyst.

2. The TFT according to claim 1, wherein the diffusion coefficient of the second metal is 1%, or less, than the diffusion coefficient of the metal catalyst.

3. The TFT according to claim 2, wherein:
the metal catalyst is nickel; and
the second metal has a positive diffusion coefficient that is less than about $10^{-7}$ cm$^2$/s.

4. The TFT according to claim 1, wherein the second metal is selected from the group consisting of Ti, Cr, Mo, W, and an alloy thereof.

5. The TFT according to claim 1, wherein the semiconductor layer is crystallized using a super grain silicon (SGS) crystallization technique.

6. The TFT according to claim 1, wherein the source and drain electrodes are formed from a layer formed of one selected from the group consisting of Ti, Cr, Mo, W, and alloy thereof, or a triple layer formed of Ti/Al/Ti or Mo/Al/Mo.

7. The TFT according to claim 1, wherein the surface region of the semiconductor layer further includes n-type impurities, p-type impurities, and/or defects caused by ion processing or plasma processing.

8. An organic light emitting diode (OLED) display device comprising:
   a substrate;
   a gate electrode disposed on the substrate;
   a gate insulating layer disposed on the gate electrode;
   a semiconductor layer disposed on the gate insulating layer and crystallized using a metal catalyst;
   source and drain electrodes disposed on the semiconductor layer and electrically connected to respective source and drain regions of the semiconductor layer;
   a first electrode electrically connected to one of the source and drain electrodes;
   an organic layer disposed on the first electrode, comprising an emission layer (EML); and
   a second electrode disposed on the organic layer,
   wherein a second metal, which is different from the metal catalyst, is disposed in a surface region of the semiconductor layer, which faces the organic layer, and
   wherein the second metal is in the form of a metal silicide.

9. The OLED display device according to claim 8, wherein the source and drain electrodes are formed of one selected from the group consisting of Ti, Cr, Mo, W, and alloy thereof, or a triple layer formed of Ti/Al/Ti or Mo/Al/Mo.

10. The TFT according to claim 1, wherein the second metal is in the form of a metal silicide.

* * * * *